United States Patent
Kakinuma et al.

(10) Patent No.: US 9,523,898 B2
(45) Date of Patent: Dec. 20, 2016

(54) DISPLAY APPARATUS

(71) Applicant: Panasonic Liquid Crystal Display Co., Ltd., Hyogo (JP)

(72) Inventors: Norihisa Kakinuma, Hyogo (JP); Teruhisa Nakagawa, Hyogo (JP); Masahiro Ishii, Hyogo (JP); Daisuke Kajita, Hyogo (JP)

(73) Assignee: Panasonic Liquid Crystal Display Co., Ltd., Hyogo (JP)

( * ) Notice: Subject to any disclaimer, the term of this patent is extended or adjusted under 35 U.S.C. 154(b) by 4 days.

(21) Appl. No.: 14/733,177

(22) Filed: Jun. 8, 2015

(65) Prior Publication Data
US 2015/0268526 A1 Sep. 24, 2015

Related U.S. Application Data

(63) Continuation of application No. PCT/JP2013/007554, filed on Dec. 24, 2013.

(30) Foreign Application Priority Data

Jan. 11, 2013 (JP) .................................. 2013-004047
Dec. 2, 2013 (JP) .................................. 2013-249053

(51) Int. Cl.
*H01L 29/04* (2006.01)
*G02F 1/1362* (2006.01)
(Continued)

(52) U.S. Cl.
CPC ....... *G02F 1/136227* (2013.01); *G02F 1/1337* (2013.01); *G02F 1/1368* (2013.01);
(Continued)

(58) Field of Classification Search
CPC .............. H01L 27/124; H01L 29/41733; G02F 1/133345; G02F 1/1337; G02F 1/136227
(Continued)

(56) References Cited

U.S. PATENT DOCUMENTS

2007/0279564 A1  12/2007  Iwato et al.
2010/0032681 A1*  2/2010  Kuriyagawa ..... H01L 29/78621
                                                     257/72
2012/0268678 A1  10/2012  Tomioka et al.

FOREIGN PATENT DOCUMENTS

JP  2007-248898  9/2007
JP  2007-322563  12/2007
(Continued)

OTHER PUBLICATIONS

International Search Report issued in International Application No. PCT/JP2013/007554, Mar. 4, 2014, 4 pages.

*Primary Examiner* — H. Jey Tsai
(74) *Attorney, Agent, or Firm* — Hamre, Schumann, Mueller & Larson, P.C.

(57) ABSTRACT

Provided is a display apparatus, including a substrate including: a pixel electrode; an organic insulating film; a common electrode laminated on the organic insulating film so as to be opposed to the pixel electrode via an insulating layer; a common signal line connected to the common electrode; and a transistor configured to apply, to the pixel electrode, a voltage signal input to a signal line. The pixel electrode is connected to a source electrode of the transistor via a through hole formed through the organic insulating film. The through hole includes, in at least one extending portion formed by retreating the organic insulating film toward an outer side of the through hole, a stepped portion formed by laminating a part of the common signal line.

14 Claims, 19 Drawing Sheets

(51) Int. Cl.
*G02F 1/1333* (2006.01)
*G02F 1/1337* (2006.01)
*G02F 1/1343* (2006.01)
*G02F 1/1368* (2006.01)
*H01L 27/12* (2006.01)
*H01L 29/417* (2006.01)

(52) U.S. Cl.
CPC .... *G02F 1/13439* (2013.01); *G02F 1/133345* (2013.01); *H01L 27/124* (2013.01); *H01L 29/41733* (2013.01)

(58) Field of Classification Search
USPC .... 257/59, 72, 389; 349/149, 141, 106, 120, 349/43, 111
See application file for complete search history.

(56) References Cited

FOREIGN PATENT DOCUMENTS

| | | |
|---|---|---|
| JP | 2009-217096 | 9/2009 |
| JP | 2012-226249 | 11/2012 |

* cited by examiner

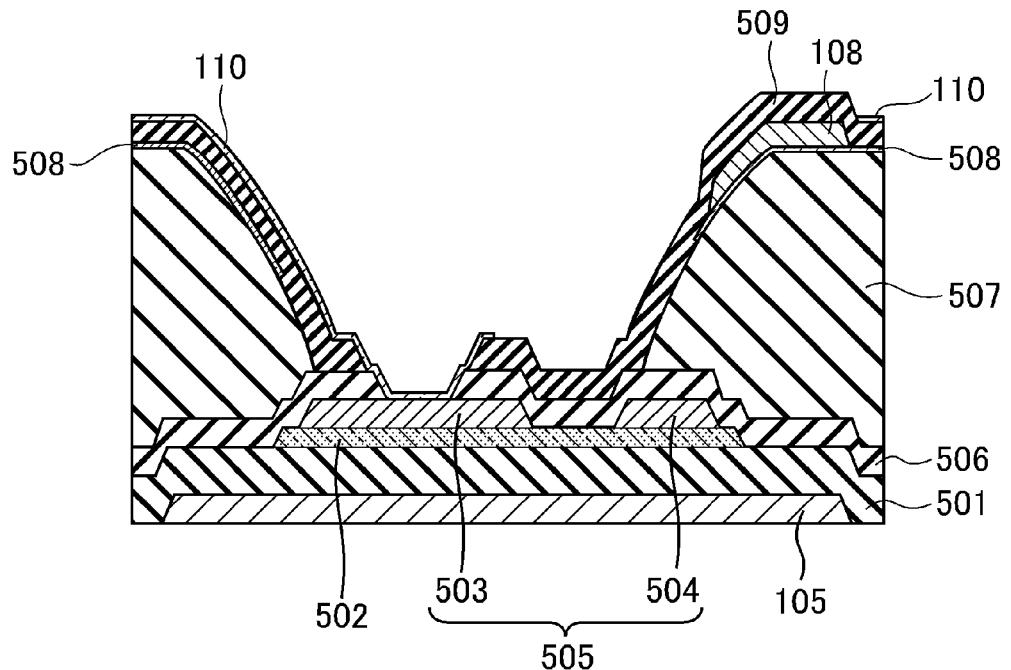
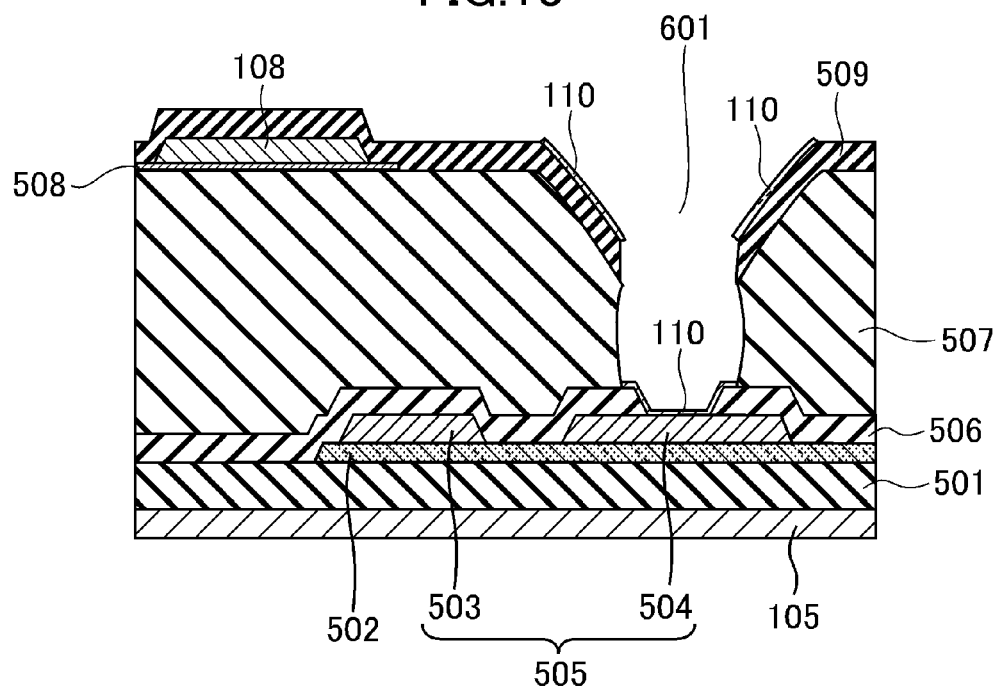

DISPLAY APPARATUS

CROSS-REFERENCE TO RELATED APPLICATION

This application is Bypass Continuation of international patent application PCT/JP2013/007554, filed: Dec. 24, 2013 designating the United States of America, the entire disclosure of which is incorporated herein by reference. Priority is claimed based on Japanese patent applications JP2013-004047, filed: Jan. 11, 2013 and JP2013-249053, filed: Dec. 2, 2013. The entire disclosure of Japanese patent applications JP2013-004047 and JP2013-249053 is incorporated herein by reference in its entirety.

BACKGROUND

1. Field of the Invention

This application relates to a display apparatus.

2. Description of the Related Art

In general, a liquid crystal display apparatus includes a TFT substrate having thin film transistors (TFTs), pixel electrodes, and the like arranged thereon, and an opposing substrate having color filters formed thereon. Further, in the TFT substrate, the pixel electrode and a source electrode of the TFT are connected to each other via a through hole formed through an insulating layer.

Along with the demand for higher resolution of pixels in recent years, the diameter of the through hole has been significantly decreased. When an alignment film is formed on the TFT substrate having the TFTs, the pixel electrodes, and the like formed thereon, an alignment film solution is applied on the TFT substrate. At this time, it may be difficult for the alignment film solution to enter the through hole, and minute recessed defects may be generated in the alignment film formed on the TFT substrate. In view of this, in order to facilitate the entrance of the alignment film solution into the through hole, there is known a technology of forming a step in the through hole with use of a step forming layer (see Japanese Patent Application Laid-open No. 2007-322563).

However, forming a step in the through hole is not enough for sufficient entrance of the alignment film solution into the through hole, and application unevenness of the alignment film may be caused on the TFT substrate side. As a result, brightness unevenness of the display apparatus may be caused.

This application has been made in view of the above-mentioned problem, and has an object to provide a display apparatus capable of further facilitating the entrance of the alignment film solution into the through hole and sufficiently suppressing the application unevenness of the alignment film, thereby further equalizing the brightness.

SUMMARY (1) According to one embodiment of this application, there is provided a display apparatus, including a substrate including: a pixel electrode; an organic insulating film; a common electrode laminated on the organic insulating film so as to be opposed to the pixel electrode via an insulating layer; a common signal line connected to the common electrode; and a transistor configured to apply, to the pixel electrode, a voltage signal input to a signal line, the pixel electrode being connected to a source electrode of the transistor via a through hole formed through the organic insulating film, the through hole including, in at least one extending portion formed by retreating the organic insulating film toward an outer side of the through hole, a stepped portion formed by laminating a part of the common signal line.

(2) In the display apparatus according to Item (1), the at least one extending portion has a width smaller than a width of the through hole.

(3) In the display apparatus according to Item (1) or (2), the display apparatus further includes a gate line connected to a gate electrode of the transistor, and the at least one extending portion is formed in a direction along the gate line.

(4) In the display apparatus according to Item (3), the common signal line is arranged along the gate line, the common signal line includes a common extending portion extending toward the at least one extending portion, and the through hole includes, in the at least one extending portion, a stepped portion formed by laminating a part of the common extending portion.

(5) In the display apparatus according to any one of Items (1) to (4), the at least one extending portion includes two extending portions, and the two extending portions are formed on both sides of the through hole.

(6) In the display apparatus according to any one of Items (1) to (5), the display apparatus further includes an alignment film on the substrate.

(7) In the display apparatus according to Item (6), the alignment film is formed by being applied on the substrate by an ink jet system.

(8) In the display apparatus according to Item (3), the gate electrode is formed of a part of the gate line.

(9) In the display apparatus according to any one of Items (1) to (8), the common electrode is made of ITO.

(10) In the display apparatus according to any one of Items (1) to (9), the common signal line is made of a metal.

(11) In the display apparatus according to Item (1), the at least one extending portion is formed in a direction along the signal line, and has the same width in a direction along the gate line as the through hole.

(12) In the display apparatus according to Item (11), the common signal line has a cut-out portion in a part of an inclined portion of the through hole, and the stepped portion is further formed along with the cut-out portion.

(13) In the display apparatus according to Item (11) or (12), the common signal line has a protruding portion in a part of an inclined portion of the through hole, and the stepped portion is further formed along with the protruding portion.

(14) In the display apparatus according to any one of Items (11) to (13), the stepped portion is formed on an opposite side to the pixel electrode side.

BRIEF DESCRIPTION OF THE DRAWINGS

FIG. 17 is a view for schematically illustrating a XVII-XVII cross section of FIG. 16.

FIG. 18 is a view for schematically illustrating a XVIII-XVIII cross section of FIG. 16.

DETAILED DESCRIPTION

Figure 1:
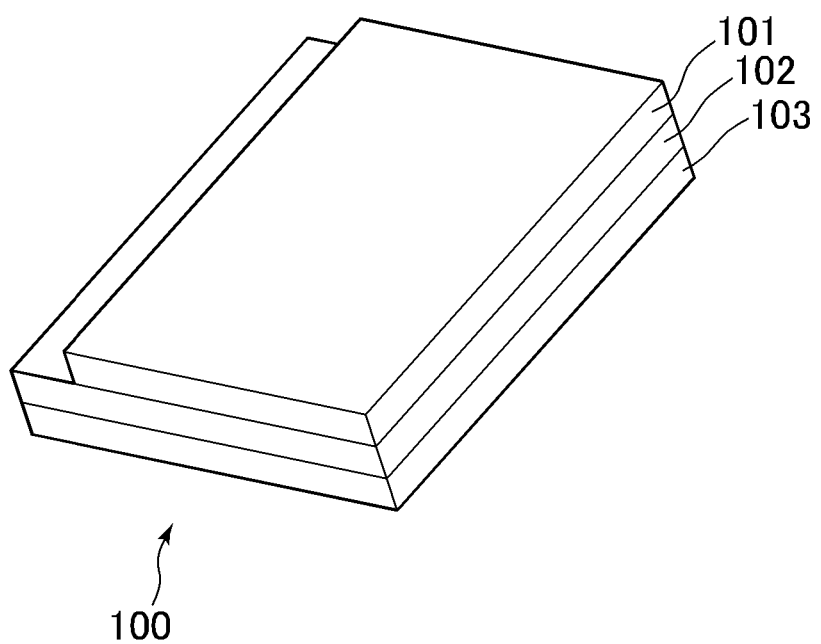
FIG. 1 is a schematic view for illustrating a display apparatus according to a first embodiment of this application.

Referring to the accompanying drawings, embodiments of this application are described below. In the drawings, the same or similar components are denoted by the same reference symbols, and repetitive description thereof is omitted.

First Embodiment

FIG. 1 is a schematic view for illustrating a display apparatus according to a first embodiment of this application. As illustrated in FIG. 1, for example, a display apparatus 100 includes a TFT substrate 102 having thin film transistors (TFTs) and the like (not shown) formed thereon, and an opposing substrate 101 having color filters (not shown) formed thereon and being opposed to the TFT substrate 102. Further, the display apparatus 100 includes a liquid crystal material (not shown) sealed in a region sandwiched between the TFT substrate 102 and the opposing substrate 101, and a backlight unit 103 positioned in contact with the TFT substrate 102 on an opposite side to the opposing substrate 101 side of the TFT substrate 102. Note that, the configuration of the display apparatus 100 illustrated in FIG. 1 is merely an example, and this embodiment is not limited thereto.

Figure 2:
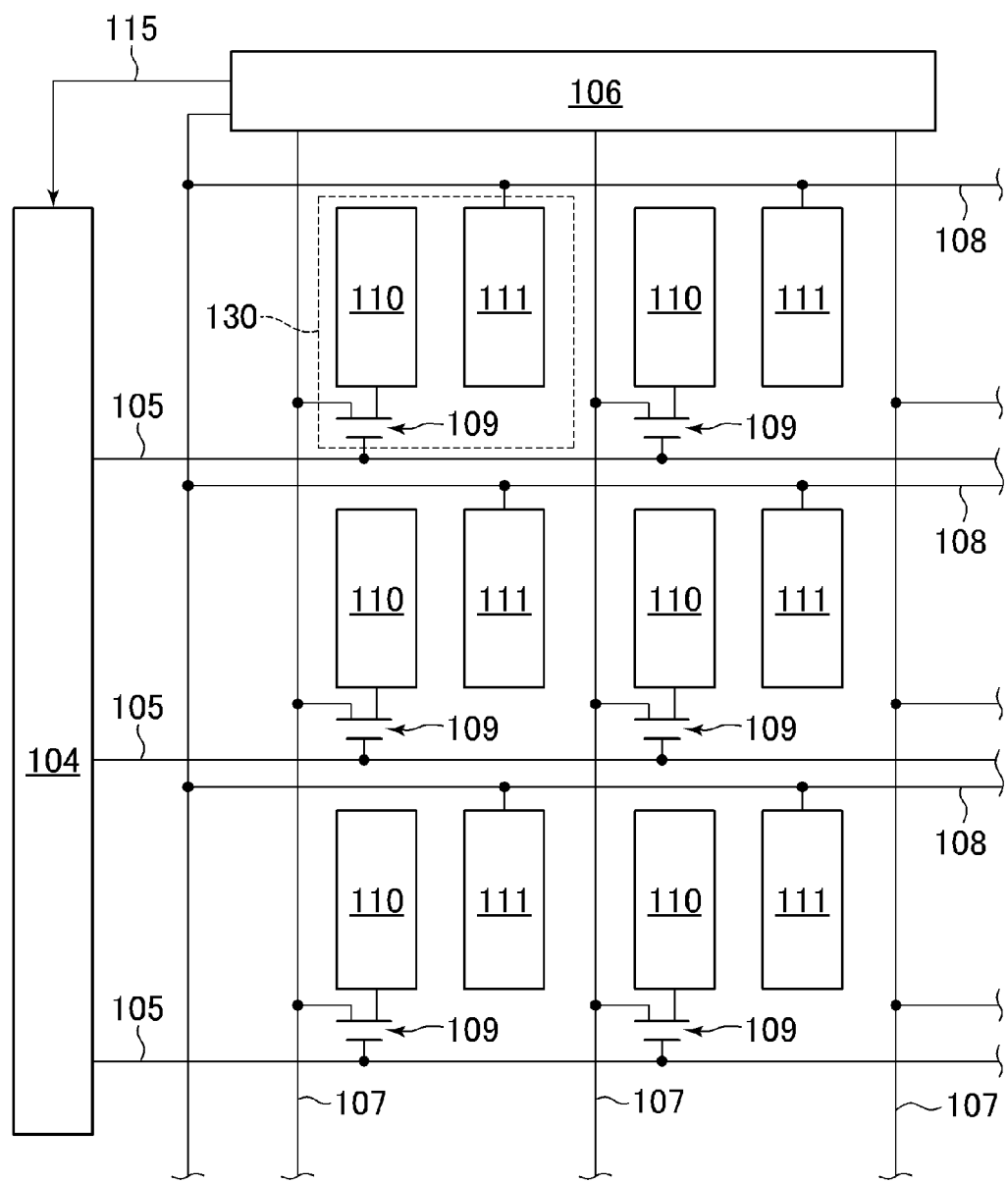
FIG. 2 is a conceptual diagram of a pixel circuit formed on a TFT substrate illustrated in FIG. 1.

FIG. 2 is a conceptual diagram of a pixel circuit formed on the TFT substrate illustrated in FIG. 1. As illustrated in FIG. 2, the TFT substrate 102 includes a plurality of gate lines 105 arranged at substantially equal intervals in a lateral direction of FIG. 2, and a plurality of drain lines 107 arranged at substantially equal intervals in a vertical direction of FIG. 2. Further, the gate lines 105 are connected to a shift register circuit 104, and the drain lines 107 are connected to a driver 106.

The shift register circuit 104 includes a plurality of basic circuits (not shown) corresponding to the plurality of gate lines 105, respectively. Note that, each basic circuit includes a plurality of TFTs and capacitors, and outputs, to the corresponding gate line 105, a gate signal in a high voltage during a corresponding gate scanning period (signal high period) in one frame period and in a low voltage during other periods (signal low period) in accordance with a control signal 115 from the driver 106.

Each pixel 130 sectioned in matrix by the gate lines 105 and the drain lines 107 includes a TFT 109, a pixel electrode 110, and a common electrode 111. In this case, a gate of the TFT 109 is connected to the gate line 105. One of a source electrode and a drain electrode of the TFT 109 is connected to the drain line 107, and the other thereof is connected to the pixel electrode 110. Further, the common electrode 111 is connected to a common signal line 108. Further, the pixel electrode 110 and the common electrode 111 are arranged so as to be opposed to each other. Further, the respective pixels 130 collectively form a pixel forming region.

Next, the operation of the pixel circuit configured as described above is schematically described. The driver 106 applies a reference voltage to the common electrode 111 via the common signal line 108. Further, the shift register circuit 104 controlled by the driver 106 outputs a gate signal to the gate of the TFT 109 via the gate line 105. Further, the driver 106 supplies a voltage of a video signal to the TFT 109 to which the gate signal is output via the drain line 107, and the voltage of the video signal is applied to the pixel electrode 110 via the TFT 109. At this time, a potential difference is generated between the pixel electrode 110 and the common electrode 111.

Then, the driver 106 controls the potential difference to control the alignment of liquid crystal molecules of the liquid crystal material. In this case, light from the backlight unit 103 is guided to the liquid crystal material, and hence the control of the alignment of liquid crystal molecules and the like as described above enables adjustment of the amount of light from the backlight unit 103, with the result that an image can be displayed.

Figure 3:
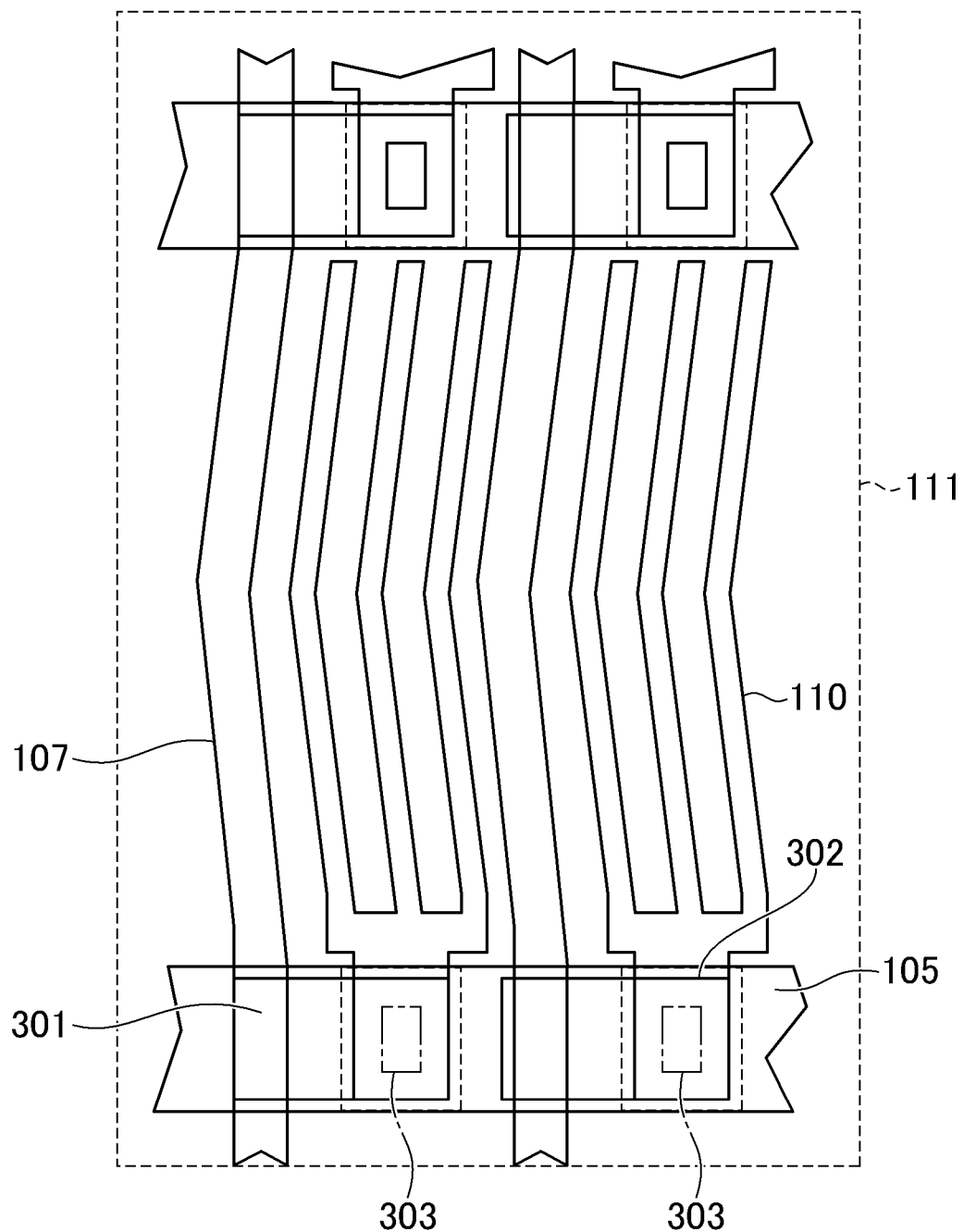
FIG. 3 is a view for schematically illustrating a configuration of a pixel illustrated in FIG. 2.

FIG. 3 is a view for schematically illustrating the configuration of the pixel illustrated in FIG. 2. Specifically, FIG. 3 is an example of a schematic plan view of the periphery of the pixel 130. As illustrated in FIG. 3, as described above, the plurality of gate lines 105 arranged at substantially equal intervals in the lateral direction and the plurality of drain lines 107 arranged at substantially equal intervals in the vertical direction are formed. The drain line 107 is connected to a semiconductor layer 302 of the TFT 109.

Further, the common electrode 111 is arranged so as to be opposed to the pixel electrode 110 and cover the entire pixel region. The pixel electrode 110 has, for example, a comb-teeth shape as illustrated in FIG. 3. Further, one end of the pixel electrode 110 is connected to the source electrode of the TFT 109 via a through hole 301 formed above the gate line 105. Specifically, an opening portion is formed at the center of the through hole 301, and the pixel electrode 110 and the source electrode of the TFT 109 are connected to each other in the opening portion. Note that, description is specifically made with reference to FIG. 4. Further, the shapes and the like of the pixel electrode 110, the gate line 105, and the drain line 107 illustrated in FIG. 3 are merely examples, and this embodiment is not limited thereto.

Figure 4:
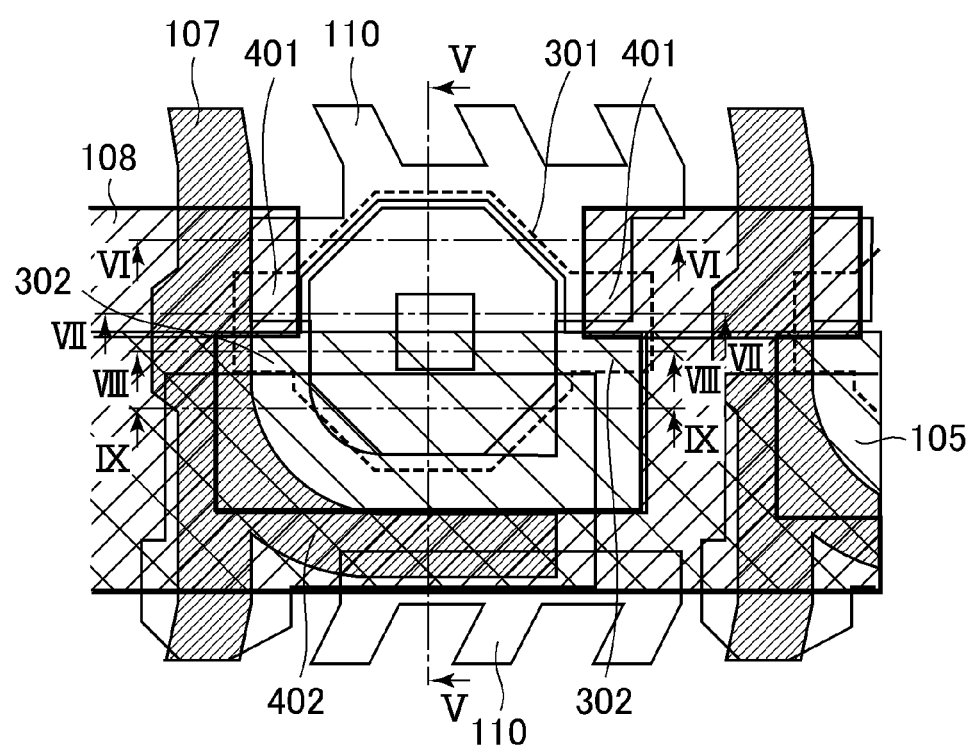
FIG. 4 is a planview for schematically illustrating a periphery of a through hole for connecting a pixel electrode and a source electrode of a TFT to each other.

FIG. 4 is a plan view for schematically illustrating the periphery of the through hole for connecting the pixel electrode and the source electrode of the TFT to each other in this embodiment. Note that, FIG. 4 is merely an example, and this embodiment is not limited thereto. For example, specific shapes, arrangement, and the like of the pixel electrode 110 and the drain line 107 are merely examples. Further, FIG. 4 is an illustration of a pattern, and hence, in an actual case, the shape of each portion changes during the manufacturing process, such as the shape of the through hole 301 becomes a circular shape after the manufacturing process, and the actual shape becomes a shape based on FIG. 4. Further, in FIG. 4, in order to facilitate the description, the through hole 301 is indicated by the dotted line.

As illustrated in FIG. 4, the common signal line 108 is arranged along the gate line 105, and includes a common extending portion 401. The common extending portion 401 is formed as follows. For example, the common extending portion 401 is extended upward in FIG. 4 and is further extended toward the through hole 301. In other words, as illustrated in FIG. 4, the common extending portion 401 has a T-shape, for example. Note that, the shape of the common extending portion 401 illustrated in FIG. 4 is merely an example, and other shapes may be employed.

The drain line 107 is arranged so as to be substantially orthogonal to the gate line 105 as described above. Further, a part of the drain line 107 is extended in the direction of the gate line 105, and as described later, a part of the extended part (drain extending portion 402) forms a drain electrode 503 of the TFT 109.

As described later, the pixel electrode 110 is connected to, at a center portion of the through hole 301, a signal line 505 that forms a source electrode 504 of the TFT 109.

The through hole 301 includes, for example, rectangular extending portions 302 on both sides in the direction along the gate line 105. As described later, the extending portion 302 is formed by retreating an organic insulating film 507 toward the outer side of the through hole 301. Note that, specific configurations of the through hole 301 and the extending portion 302 are described with reference to FIG. 5 to FIG. 9. Further, the configuration illustrated in FIG. 4 is merely an example, and this embodiment is not limited thereto. For example, description is made above of the case where the extending portion 302 of the through hole 301 has a rectangular shape and two extending portions 302 are formed at both ends of the through hole 301, but the shape of the extending portion 302 may be other shapes, and the extending portion 302 may be formed in other numbers.

Figure 5:
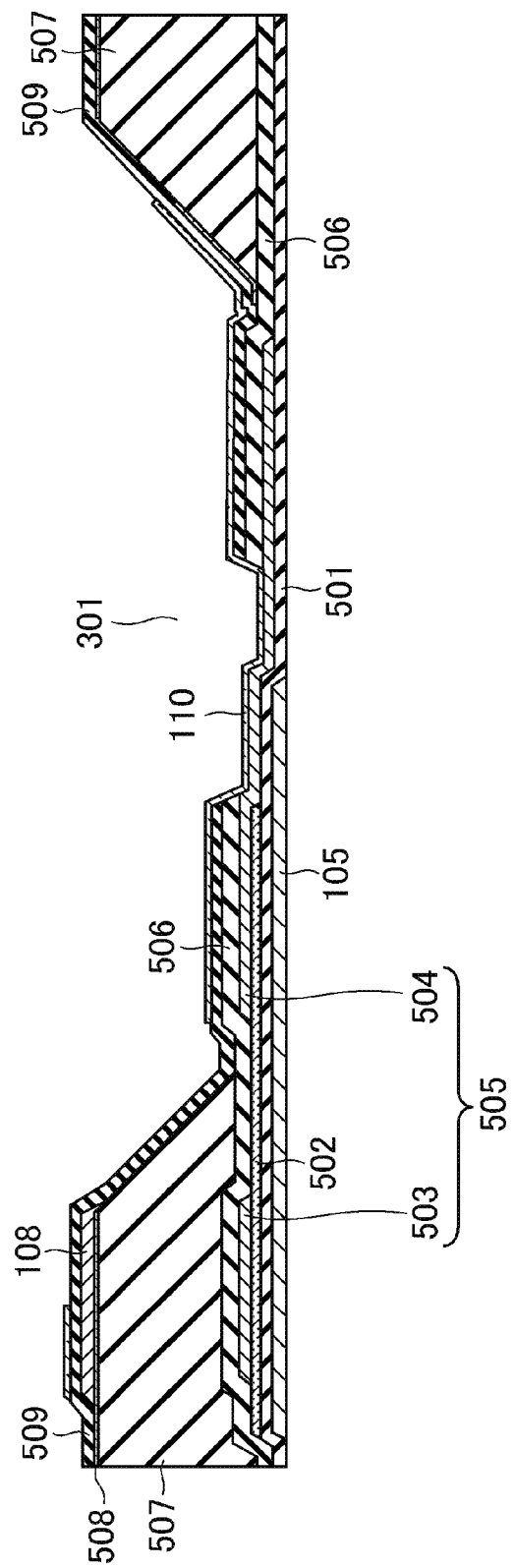
FIG. 5 is a view for schematically illustrating a V-V cross section of FIG. 4.

FIG. 5 is a view for schematically illustrating a V-V cross section of FIG. 4. Note that, in FIG. 5, a substrate on which a first insulating layer 501 and the gate line 105 are laminated is omitted.

As illustrated in FIG. 5, in the region in which the TFT 109 is formed, in the order from the substrate side (lower side of FIG. 5), the gate line 105 that forms the gate electrode, the first insulating layer 501, a semiconductor layer 502, the signal line 505 that forms the drain electrode 503 and the source electrode 504, and a second insulating layer 506 are laminated.

On the second insulating layer 506 formed on the drain electrode 503, the organic insulating film 507, a common electrode 508, the common signal line 108, and a third insulating film 509 are sequentially laminated.

Further, as illustrated in FIG. 5, the through hole 301 is formed as an opening portion surrounded by the organic insulating film 507. Further, a side wall portion of the organic insulating film 507 that forms the through hole 301 (an inclined part of the organic insulating film 507 illustrated in FIG. 5) is covered with the third insulating film 509.

On the source electrode 504 formed on the semiconductor layer 502 in a region in which the through hole 301 is formed, the second insulating layer 506, the third insulating film 509, and the pixel electrode 110 are sequentially laminated. The signal line 505 that forms the source electrode 504 is formed to be extended up to an end portion of the through hole 301. Then, the signal line 505 is connected to the above-mentioned pixel electrode 110 at the opening portion positioned substantially at the center of the through hole 301 in which the second insulating layer 506 and the third insulating film 509 are not laminated. In other words, the pixel electrode 110 and the signal line 505 are laminated at the opening portion. Note that, below the opening portion, as illustrated in FIG. 5, there are a part in which the gate line 105 is present and a part in which the gate line 105 is absent, and hence a step is formed also in the opening portion.

In a region inside the through hole 301 in which the TFT 109 is not formed (right side in FIG. 5), in the order from the substrate side, the first insulating layer 501, the signal line 505, the second insulating layer 506, the third insulating layer 509, and the pixel electrode 110 are mainly laminated.

In a region outside the through hole 301 in which the TFT 109 is not formed (right side in FIG. 5), in the order from the substrate side, the first insulating layer 501, the second insulating layer 506, the organic insulating film 507, the common electrode 508, and the third insulating layer 509 are mainly laminated. Note that, for example, the common electrode 508 is made of ITO, and the common signal line 108 is made of a metal such as Cu.

Figure 6:
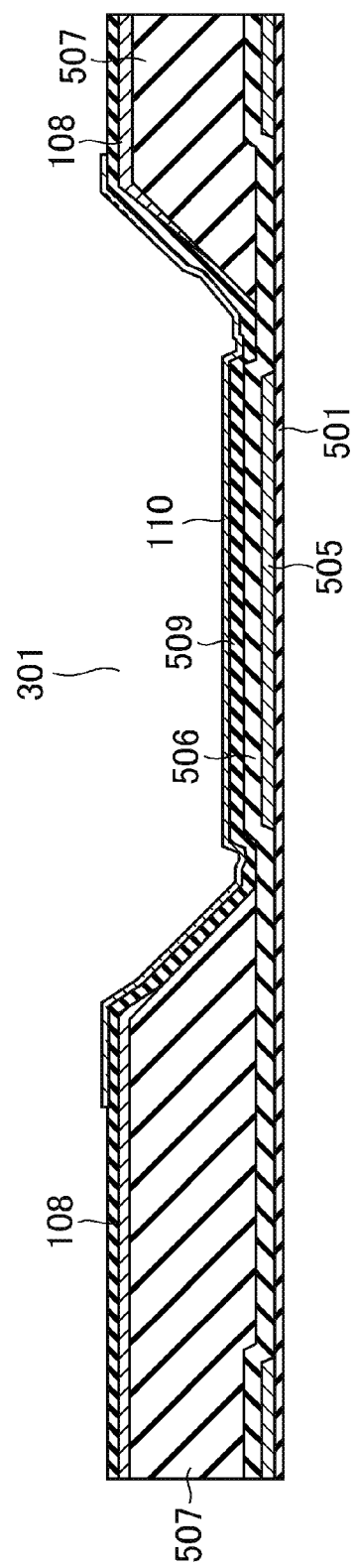
FIG. 6 is a view for schematically illustrating a VI-VI cross section of FIG. 4.

FIG. 6 is a view for schematically illustrating a VI-VI cross section of FIG. 4. As illustrated in FIG. 6, in a region inside the through hole 301, in the order from the substrate side, the first insulating layer 501, the signal line 505, the second insulating layer 506, the third insulating layer 509, and the pixel electrode 110 are laminated.

In a region outside the through hole 301, the first insulating layer 501, the second insulating layer 506, the organic insulating layer 507, the common signal line 108, and the third insulating layer 509 are mainly laminated.

Figure 7:
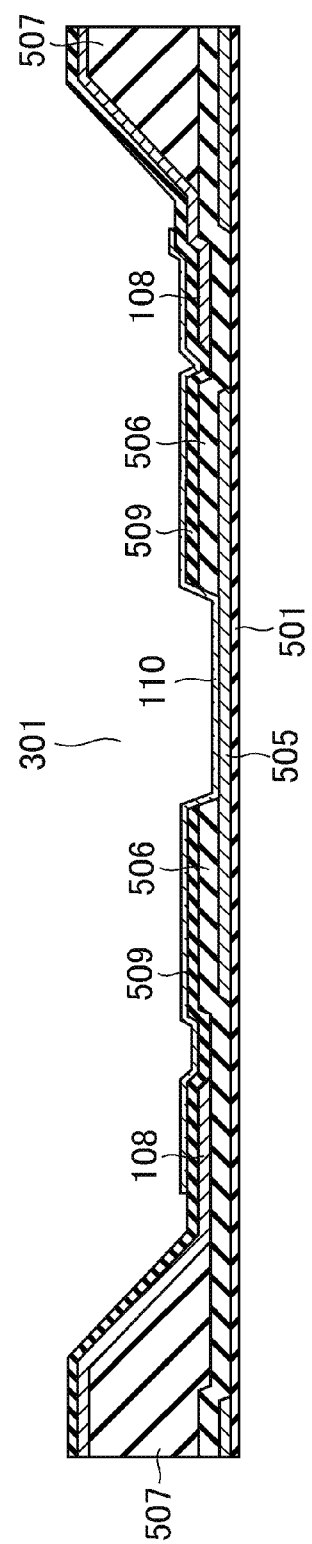
FIG. 7 is a view for schematically illustrating a VII-VII cross section of FIG. 4.

FIG. 7 is a view for schematically illustrating a VII-VII cross section of FIG. 4. Further, FIG. 8 is a view for schematically illustrating a VIII-VIII cross section of FIG. 4.

As understood from the comparison between FIG. 6 and FIG. 7, in FIG. 7, as compared to FIG. 6, the side wall portion of the organic insulating layer 507 is retreated toward the outer side of the through hole 301. In other words, in the region in which the extending portion 302 is formed, the width of a part of the through hole 301 is formed large. With this, as illustrated in FIG. 4, the extending portions 302 of the through hole 301 are formed on both sides of the through hole 301.

Figure 8:
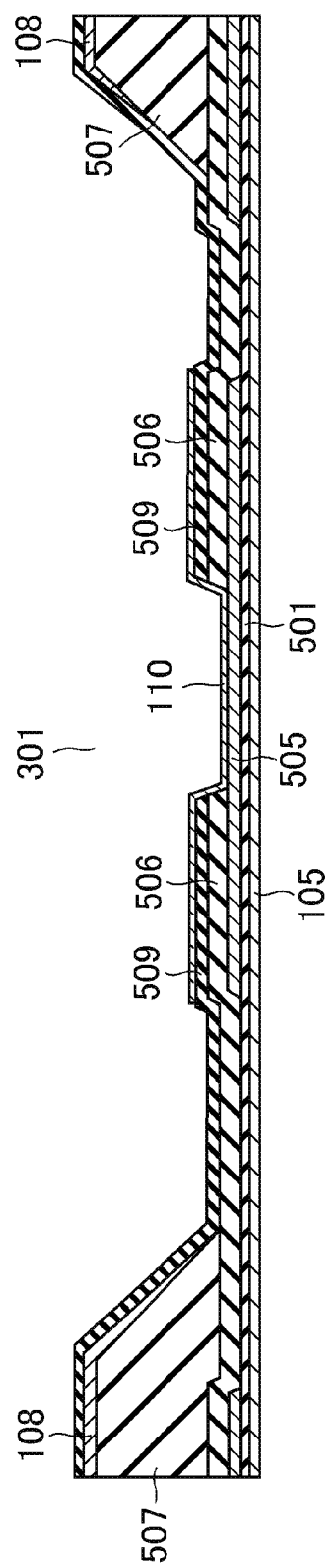
FIG. 8 is a view for schematically illustrating a VIII-VIII cross section of FIG. 4.

Further, as understood from the comparison between FIG. 7 and FIG. 8, in FIG. 7, the common signal line 108 is extended from the upper side of the organic insulating film 507 along the side wall portion of the through hole 301 to reach an inside of the through hole 301. Therefore, in partial regions on both sides inside the through hole 301, the common signal line 108 is laminated between the second insulating layer 506 and the third insulating layer 509. With this, a step is formed in the extending portion 302 of the through hole 301. Therefore, for example, when an alignment film solution is applied to the substrate in an ink jet system, it is possible to facilitate the entrance of the alignment film solution into the through hole 301 from the periphery thereof to reach the center part of the through hole 301.

Figure 9:
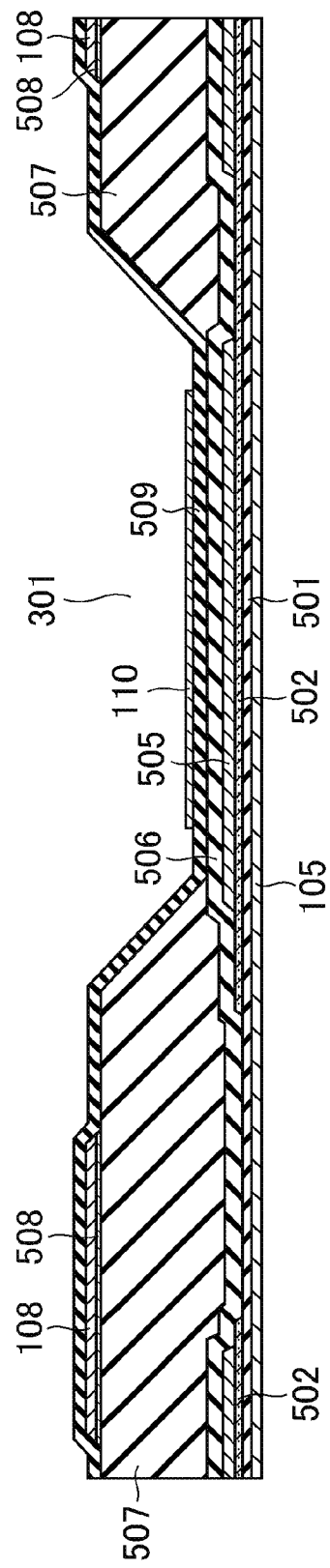
FIG. 9 is a view for schematically illustrating a IX-IX cross section of FIG. 4.

FIG. 9 is a view for schematically illustrating a IX-IX cross section of FIG. 4. As illustrated in FIG. 9, in a region in which the through hole 301 is formed, in the order from the substrate side, the gate line 105, the first insulating layer 501, the semiconductor layer 502, the signal line 505, the second insulating layer 506, the third insulating layer 509, and the pixel electrode 110 are mainly laminated. Note that, the cross sections illustrated in FIG. 4 to FIG. 9 are merely examples, and this embodiment is not limited thereto. Further, in the above, the description of similar points among the configurations in the cross sections of FIG. 4 to FIG. 9 is omitted.

Note that, although illustration is omitted in FIG. 4 to FIG. 9, on the TFT substrate 102 having the TFT 109, the pixel electrode 110, and the like formed thereon as illustrated in FIG. 4 to FIG. 9, an alignment film is thereafter laminated. Then, the opposing substrate 101 including the color filters and the like is overlapped with the TFT substrate 102 having the alignment film formed thereon, and thus the display panel is formed. Description is specifically made with reference to FIG. 10.

Figure 10:
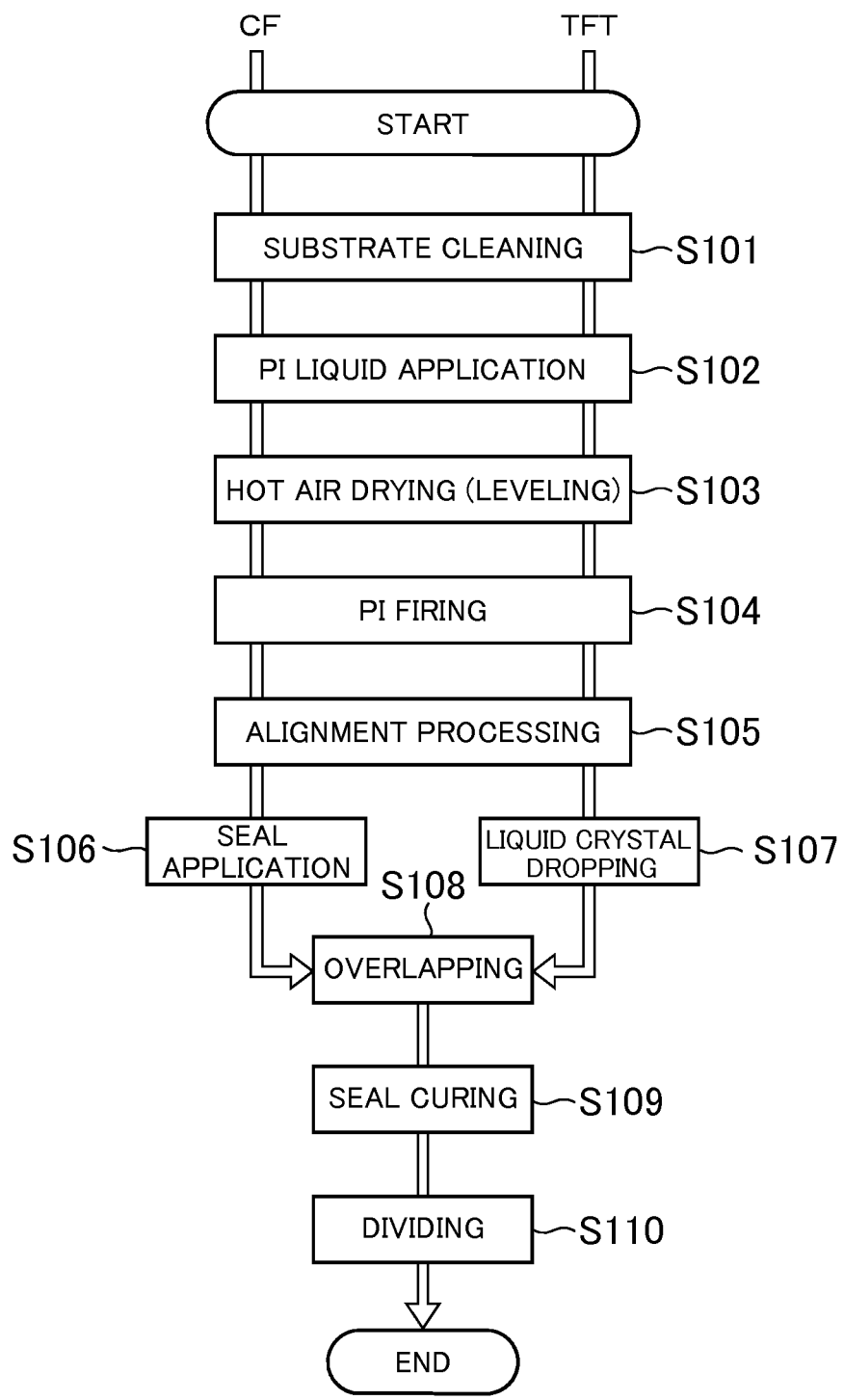
FIG. 10 is a chart for illustrating an example of a schematic flow until, after the TFT substrate and an opposing substrate are formed, both the substrates are overlapped with each other and an individual display panel is acquired.

FIG. 10 is a chart for illustrating an example of a schematic flow until, after the TFT substrate and the opposing substrate are formed, both the substrates are overlapped with each other and the individual display panel is acquired. In FIG. 10, the flow of the opposing substrate 101 is represented by CF, and the flow of the TFT substrate 102 is represented by TFT.

Note that, in FIG. 10, the flows of the processing for the TFT substrate and the opposing substrate are similar to each other until Step S105, and hence the same number is used, but it is needless to say that the TFT substrate and the opposing substrate may be separately subjected to processing up to Step S105, and then be overlapped with each other. Note that, FIG. 10 is described assuming that the TFT substrate 102 represents the TFT substrate 102 before lamination of the alignment film.

As illustrated in FIG. 10, after the TFT substrate 102 is completed, the TFT substrate 102 is cleaned (S101). Note that, in this case, the TFT substrate 102 corresponds to the TFT substrate in a state in which the alignment film is not formed. Next, on the TFT substrate 102, an alignment film solution (PI liquid) for forming the alignment film is applied (S102).

Figure 11:
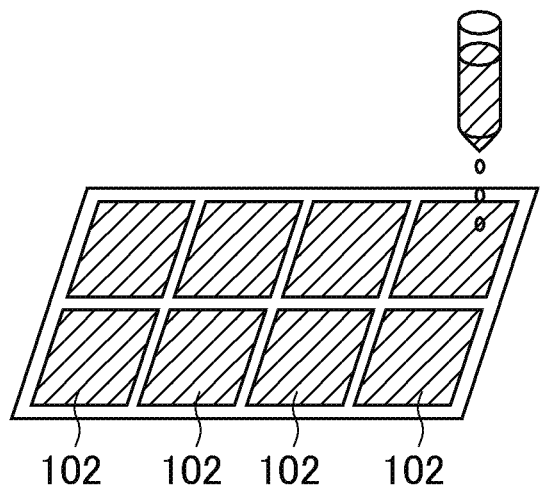
FIG. 11 is a view for illustrating a state of a substrate when an alignment film solution is applied.

In this case, for example, as illustrated in FIG. 11, the TFT substrate 102 is in a state in which a plurality of TFT substrates 102 are formed on one substrate (large plate). The same is true also in Step S101.

Figure 12:
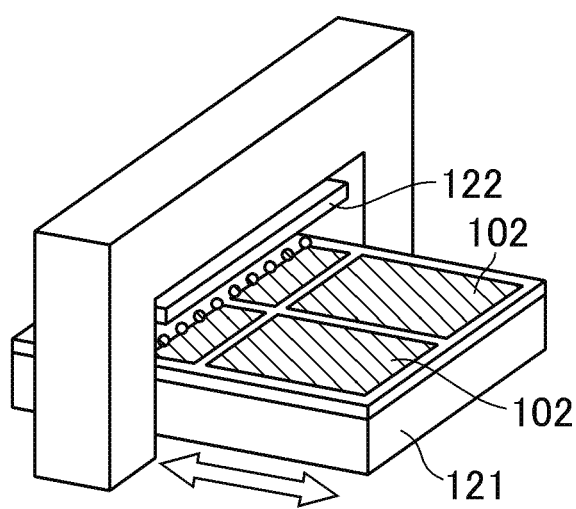
FIG. 12 is a view for illustrating a state in which the alignment film solution is applied in an ink jet system.

For example, the alignment film solution is applied as follows. As illustrated in FIG. 12, below an inkjet head 122 arranged above a stage 121, for applying the alignment film solution, the substrate having the plurality of TFT substrates 102 formed thereon is moved on the stage 121. Note that, in FIG. 11 and FIG. 12, for facilitating the understanding, a liquid crystal dropping state is also schematically illustrated.

Next, the substrate is dried by hot air (S103). Then, the alignment film solution is fired (S104), and then the substrate is subjected to alignment processing (S105). As the alignment processing, for example, rubbing alignment may be used, or light alignment with ultraviolet irradiation may be used. Note that, the processing from Step S101 to Step S105 is similarly employed for the opposing substrate 102, and hence the description of the opposing substrate 102 is omitted herein.

Next, for the opposing substrate 101, a sealing material is applied (S106), and for the TFT substrate 102, liquid crystal is dropped (S107). Then, the opposing substrate 101 and the TFT substrate 102 are overlapped with each other (S108), and then processing of curing the sealing material is carried out through ultraviolet irradiation (S109). Finally, the substrate is divided (S110), to thereby manufacture the plurality of display panels.

According to this embodiment, as described above with reference to FIG. 4, the width of the extending portion 302 of the through hole 301 is smaller than the diameter of the through hole 301, and hence the alignment film solution can easily enter the through hole 301 from the periphery of the extending portion 302. Further, as described above, a step is formed in the extending portion 302 of the through hole 301, and hence the alignment film solution can easily enter the through hole 301 from the periphery thereof to reach the center part of the through hole 301. As a result, it is possible to provide the display apparatus including the display panel capable of facilitating the entrance of the alignment film solution into the through hole 301, more sufficiently suppressing the application unevenness of the alignment film in the part in which the through hole 301 is formed, and further equalizing the brightness.

This application is not limited to the above-mentioned embodiment, and the structure described in the above-mentioned embodiment may be replaced by substantially the same structure, a structure having the same action and effect, and a structure that may achieve the same object.

Figure 13:
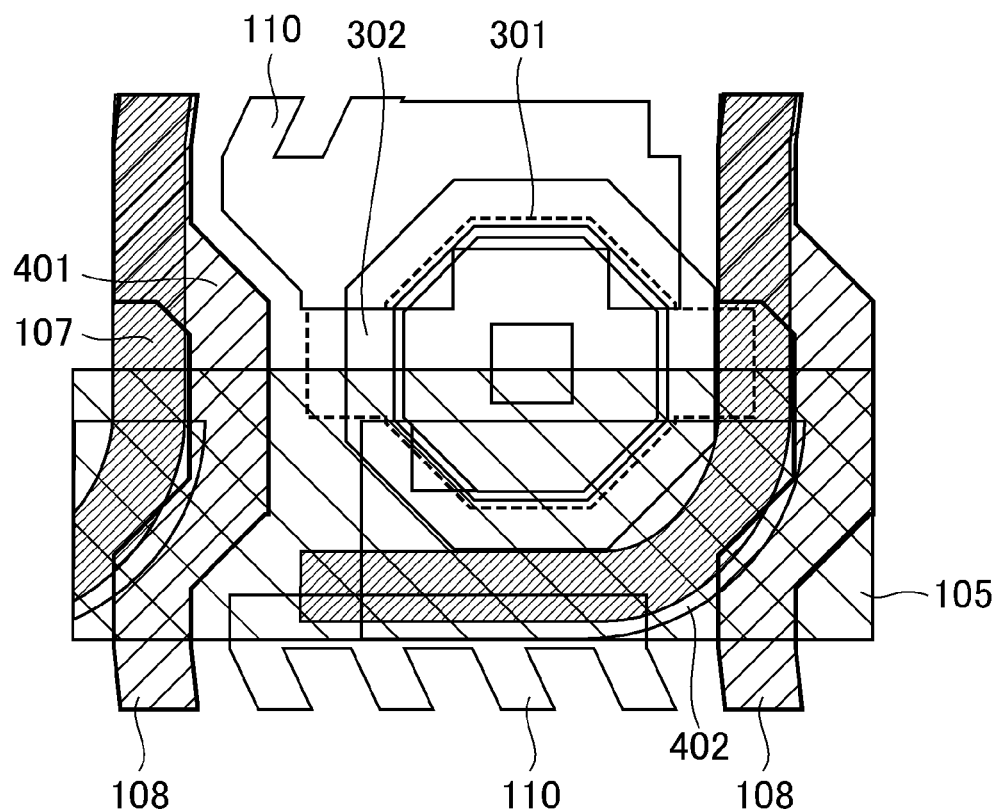
FIG. 13 is a view for illustrating a modified example of the first embodiment.
Figure 14:
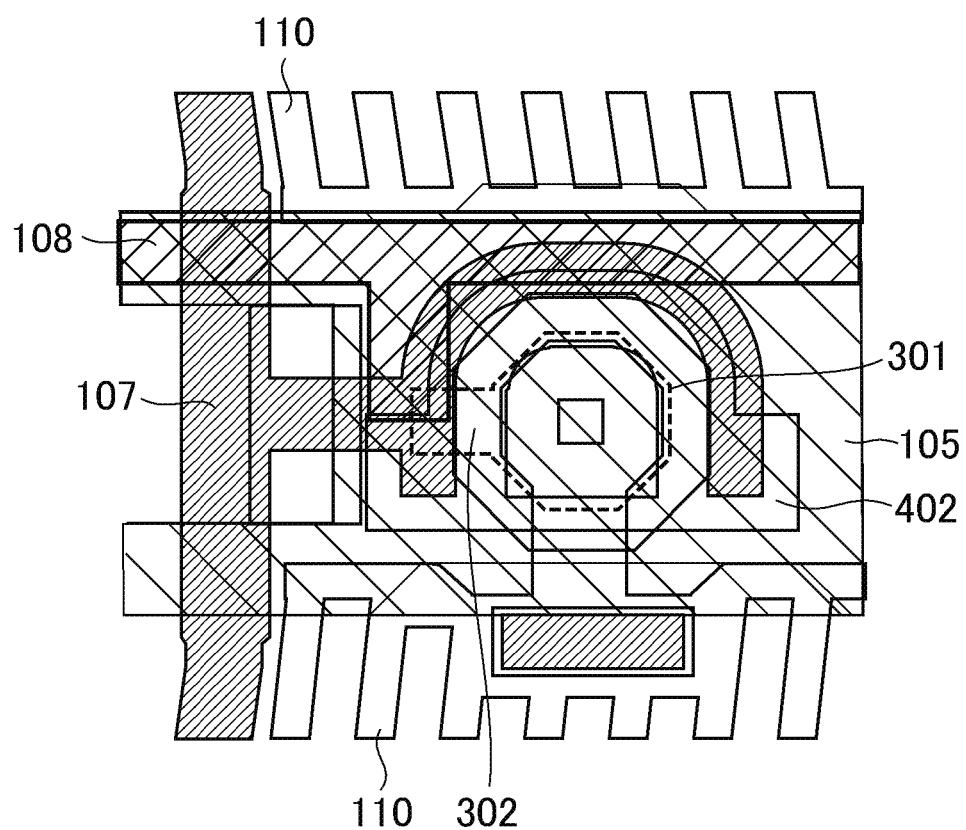
FIG. 14 is a view for illustrating another modified example of the first embodiment.
Figure 15:
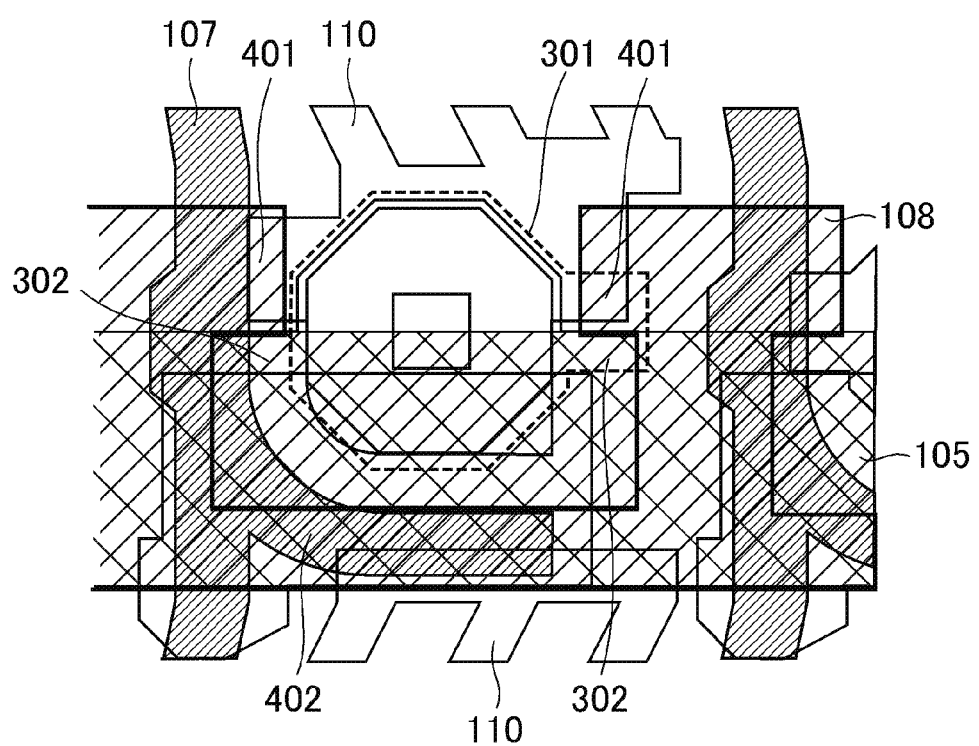
FIG. 15 is a view for illustrating another modified example of the first embodiment.

For example, other configurations are described below with reference to FIG. 13 to FIG. 15. Note that, FIG. 13 to FIG. 15 are illustrations of patterns similarly to FIG. 4, and hence, in an actual case, the shape of each portion changes during the manufacturing process, such as the shape of the through hole 301 becomes a circular shape after the manufacturing process except for the extending portion 302, and the actual shape becomes a shape based on FIG. 13 to FIG. 15. Further, in FIG. 13 to FIG. 15, for facilitating the understanding, the through hole 301 is indicated by the dotted line. Further, the cross sections of FIG. 13 to FIG. 15 are similar to that in the above-mentioned embodiment, and hence description thereof is omitted herein.

In the above-mentioned embodiment, description is mainly made of the case where the extending portions 302 formed on both sides of the through hole 301 are partially overlapped with the common signal line 108, to thereby form a step in the extending portion 308. Alternatively, for example, as illustrated in FIG. 13, a configuration including only the extending portions 302 of the through hole 301 may be formed. In other words, the configuration may be formed so that the common signal line 108 does not overlap with the extending portion 302 of the through hole 301, and the step based on the common signal line 108 is not included in the extending portion 302. Also in this case, for example, as illustrated in FIG. 13, the width of the extending portion 302 of the through hole 301 is formed smaller than the diameter of the through hole 301 so that the alignment film solution can easily enter the through hole 301 from the periphery of the extending portion 302.

Further, in the above-mentioned embodiment, description is made of the configuration in which the extending portions 302 are formed on both sides of the through hole 301, but, for example, as illustrated in FIG. 14 and FIG. 15, only one extending portion 302 may be formed so that a part of the common signal line 108 is overlapped with the extending portion 302 to form a step in the extending portion 302. Further, as long as a part of the common signal line 108 forms a step in the extending portion 302, the common signal line 108 may be configured so as to include the common extending portion 401 that simply extends toward the through hole 301 as illustrated in FIG. 14. Further, the shapes, arrangement, and the like of the gate line 105 and the drain line 107 may be set differently from those in the above-mentioned embodiment as illustrated in FIG. 14.

Further, in the above-mentioned embodiment, description is mainly made of the case where the through hole 301 includes the extending portion 302 that extends in the direction along the gate line 105, but the extending portion 302 may be formed in a different direction, such as a direction having a predetermined angle with respect to the direction parallel to the gate line 105.

Second Embodiment

Next, a second embodiment of this application is described. Note that, the description of points similar to those in the first embodiment is omitted below.

Figure 16:
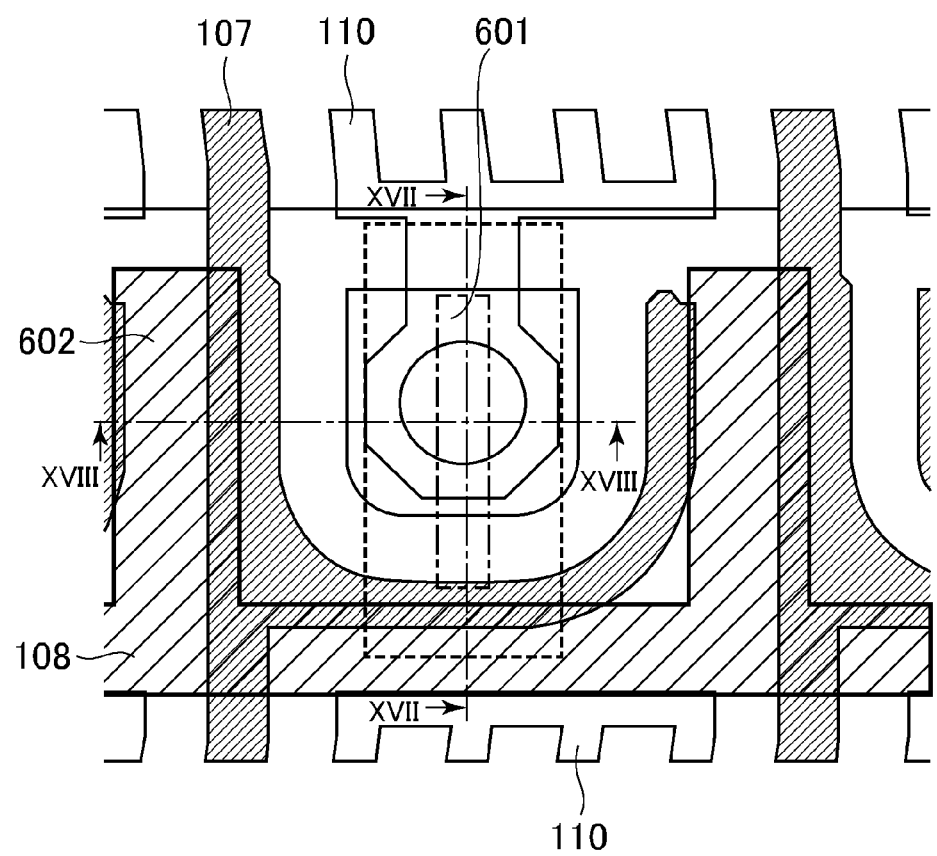
FIG. 16 is a plan view for schematically illustrating a periphery of a through hole according to a second embodiment of this application.

FIG. 16 is a view for illustrating the second embodiment. Specifically, FIG. 16 is a plan view for schematically illustrating a periphery of a through hole 601 for connecting the pixel electrode and the source electrode of the TFT to each other in this embodiment. Note that, FIG. 16 is merely an example. The point that this embodiment is not limited thereto is similar to that in the case of FIG. 4, and hence description thereof is omitted herein.

As illustrated in FIG. 16, the common signal line 108 is arranged along the gate line 105, and includes a common extending portion 602. For example, the common extending portion 602 is formed so as to extend upward in FIG. 16. Note that, the shape of the common extending portion 602 illustrated in FIG. 16 is merely an example, and other shapes may be employed.

Further, similarly to the first embodiment, the drain line 107 is arranged so as to be substantially orthogonal to the gate line 105. Further, a part of the drain line 107 is extended in the direction of the gate line 105, and the extended part forms the drain electrode 503 of the TFT 109. As described later, the pixel electrode 110 is connected to, at the center portion of the through hole 601, the signal line 505 that forms the source electrode 504 of the TFT 109.

Figure 19:
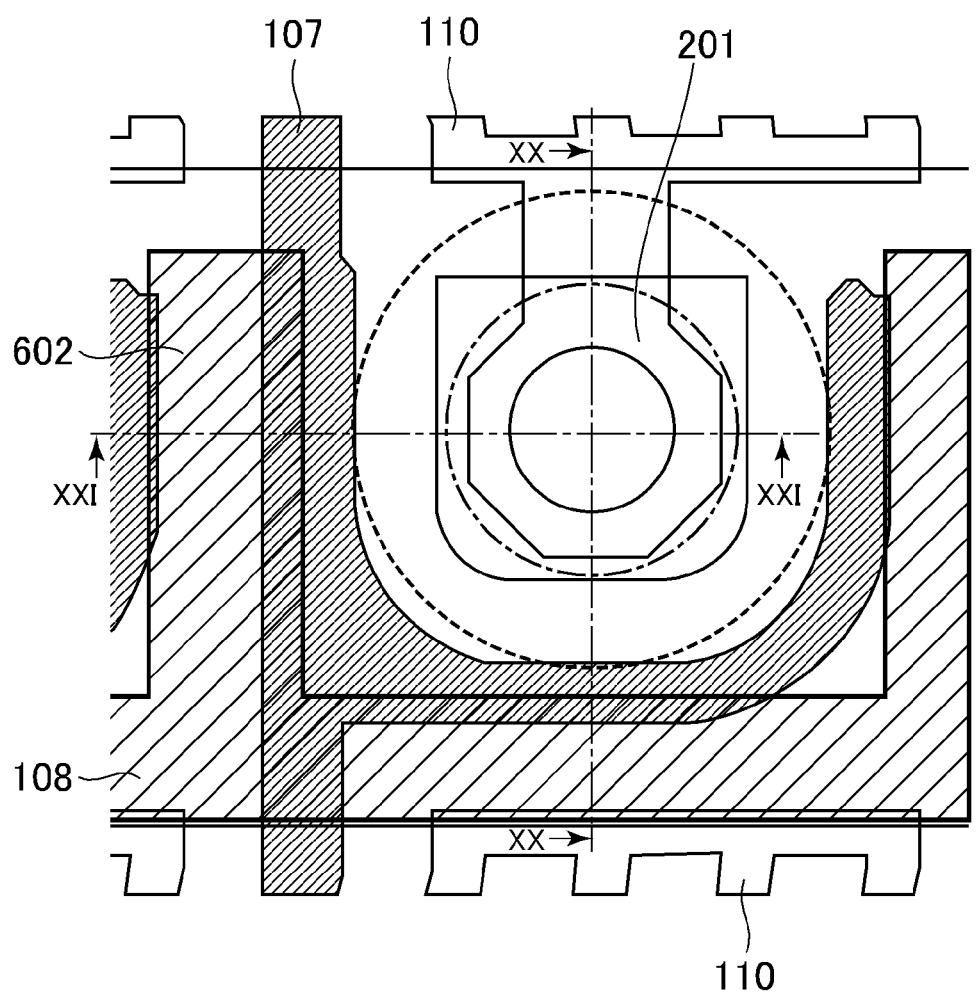
FIG. 19 is a plan view for illustrating a comparative example of the second embodiment.

Note that, in this embodiment, the through hole 601 has a rectangular shape including a long side in the direction along the drain line 107 and a short side in the direction along the gate line 105. Specifically, as compared to the case where a through hole 201 is formed into a substantially circular shape as illustrated in FIG. 19, the through hole 601 is formed to have a smaller width in the direction along the gate line 105 and a larger width in the direction along the drain line 107. With this, as compared to the case illustrated in FIG. 19, a space for a spacer to be arranged between the through holes 601 can be more secured. As a result, for example, a small or medium-sized display panel including the organic insulating film 507 can be realized. Note that, FIG. 19 is a view for illustrating a comparative example of this embodiment. As illustrated in FIG. 19, in the comparative example, the through hole 201 is formed into a substantially circular shape when viewed from above.

Further, in this embodiment, an inclined portion of the through hole 601 is formed so as to intersect with the common signal line on the opposite side to the position of the pixel electrode 110. Note that, in FIG. 16, for facilitating the understanding, when FIG. 16 is viewed from above, the position of the through hole 601 at which the inclination of the inclined portion starts is represented by the dotted line, and a part at which the inclination is ended and the organic insulating film 507 is removed is represented by the dashed-dotted line.

Figure 20:
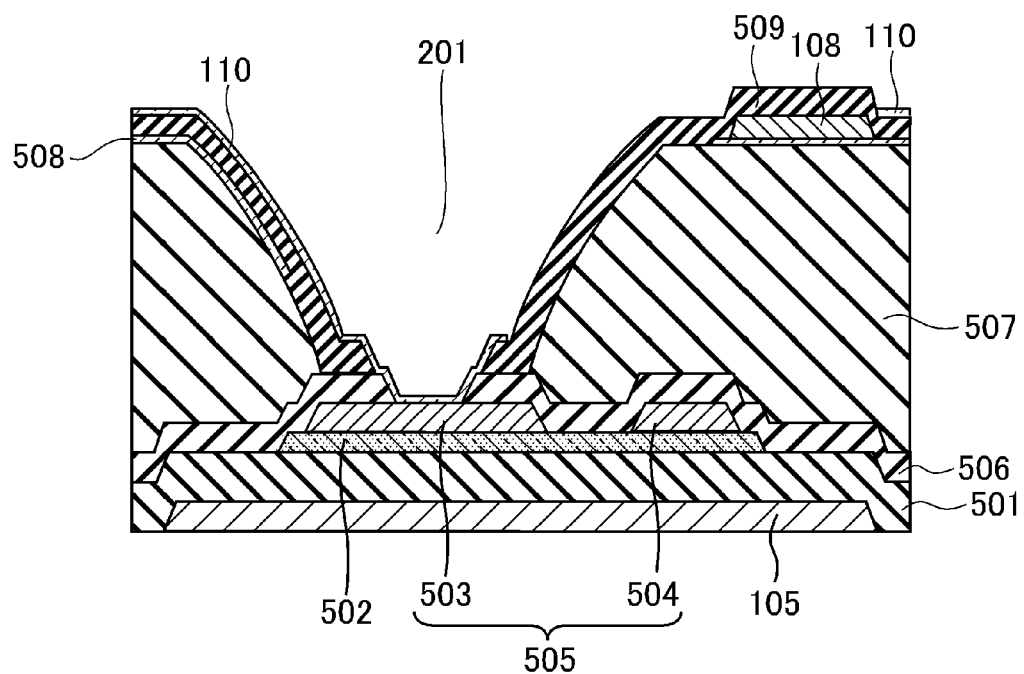
FIG. 20 is a view for schematically illustrating a XX-XX cross section of FIG. 19.
Figure 21:
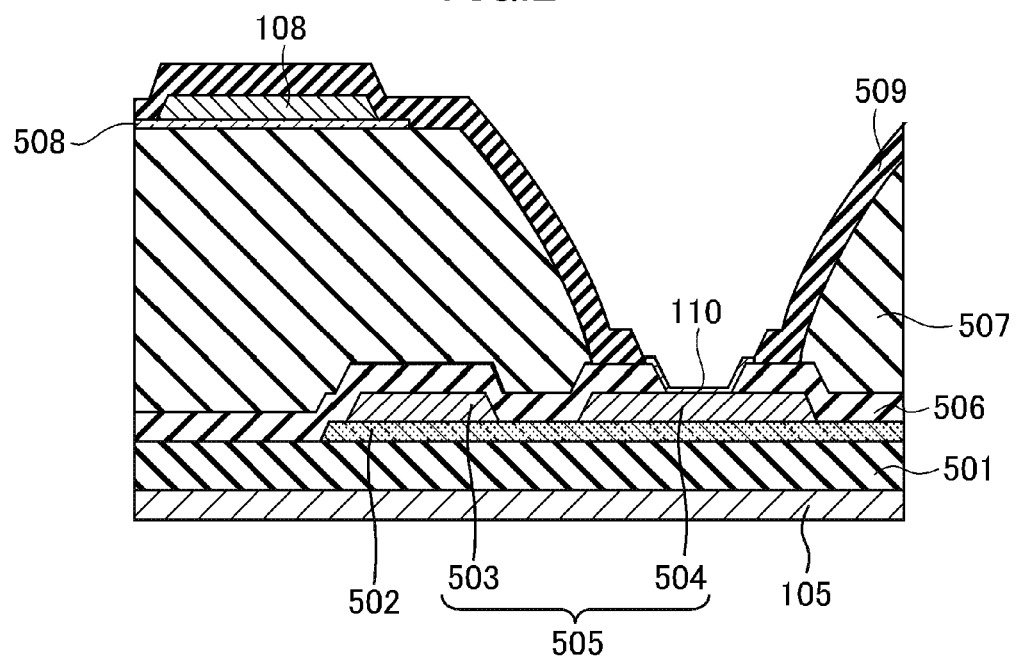
FIG. 21 is a view for schematically illustrating a XXI-XXI cross section of FIG. 19.

Next, the cross section in the periphery of the through hole illustrated in FIG. 16 is schematically described. FIG. 17 is a view for schematically illustrating a XVII-XVII cross section of FIG. 16. Further, FIG. 18 is a view for schematically illustrating a XVIII-XVIII cross section of FIG. 16. Note that, in FIG. 17 and FIG. 18, the substrate on which the first insulating layer 501 and the gate line 105 are laminated is omitted. Further, FIG. 20 and FIG. 21 are views for schematically illustrating a XX-XX cross section and a XXI-XXI cross section of FIG. 19, respectively, which correspond to FIG. 17 and FIG. 18, respectively.

As illustrated in FIG. 17, in the region in which the TFT 109 is formed, in the order from the substrate side (lower side of FIG. 17), the gate line 105 that forms the gate electrode, the first insulating layer 501, the semiconductor layer 502, the signal line 505 that forms the drain electrode 503 and the source electrode 504, and the second insulating layer 506 are laminated.

On the second insulating layer 506 formed on the drain electrode 503, the organic insulating film 507, the common electrode 508, the common signal line 108, and the third insulating film 509 are sequentially laminated. Further, as illustrated in FIG. 17, the through hole 601 is formed as an opening portion surrounded by the organic insulating film 507. Those points are similar to those in the above-mentioned first embodiment, and hence detailed description thereof is omitted herein.

Further, as illustrated in FIG. 17, in the XVII-XVII cross section of FIG. 16, the inclined portion of the organic insulating film 507 that forms the through hole 601 (inclined part of the organic insulating film 507 illustrated in FIG. 17 and FIG. 18) is covered with the third insulating film 509. Further, on the through hole 601 whose inclined portion is covered with the insulating film 509, the pixel electrode 110 is formed so that the pixel electrode 110 and the drain electrode 503 are connected to each other.

In this case, as described above, the inclined portion of the through hole 601 is formed so as to intersect with the common signal line on the opposite side to the position of the pixel electrode 110. In other words, as illustrated in FIG. 17, at the inclined portion of the through hole 601, a stepped portion is formed by laminating a part of the common signal line 108 on the organic insulating film 507. With this, it is possible to provide the display apparatus including the display panel capable of facilitating the entrance of the alignment film solution into the through hole 601, sufficiently suppressing the application unevenness of the alignment film in the part in which the through hole 601 is formed, and further equalizing the brightness.

On the other hand, as illustrated in FIG. 18, when the through hole 601 is viewed from the XVIII-XVIII cross section of FIG. 16, the width of the through hole 601 is small. Specifically, in the step of forming the through hole 601, the width of the through hole 601 is set small. Therefore, in the step of etching each of the organic insulating film 507 and the third insulating film 509 laminated thereon, a smooth inclined portion as that illustrated in FIG. 17 is not formed, and the through hole 601 includes a steep inclined portion having an inclination angle of 90° or more.

Therefore, when the pixel electrode 110 is formed on the through hole 601, as illustrated in FIG. 18, the pixel electrode 110 may be cut at the steep inclined portion. However, as described above, in the XVII-XVII cross section of FIG. 16, the through hole 610 has a smooth inclined portion.

Therefore, the pixel electrode 110 is not cut, but connected to the drain electrode 503. Therefore, a resistance value of a wiring portion in the pixel electrode 110 at which the pixel electrode 110 and the drain electrode 503 are connected to each other is increased, but this does not cause any particular problem in drive of the pixels. Further, simultaneously, the width of the through hole 601 in the direction along the gate line 105 can be decreased, and hence the space for the spacer to be arranged between the through holes 601 can be more secured.

According to this embodiment, as described above, the space for the spacer can be more secured. Further, it is possible to provide the display apparatus including the display panel capable of facilitating the entrance of the alignment film solution into the through hole 601, sufficiently suppressing the application unevenness of the alignment film in the part in which the through hole 601 is formed, and further equalizing the brightness.

Note that, this application is not limited to the above-mentioned embodiment, and the structure described in the above-mentioned embodiment may be replaced by substantially the same structure, a structure having the same action and effect, and a structure that may achieve the same object.

Figure 22:
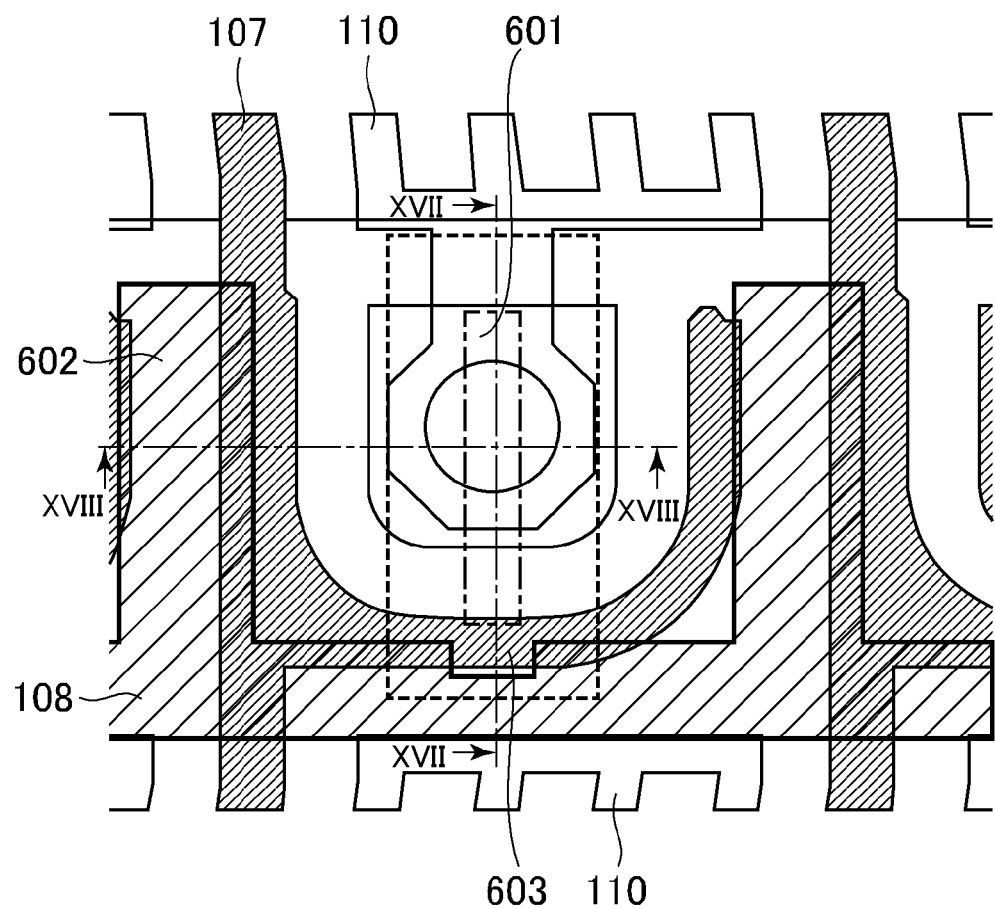
FIG. 22 is a view for illustrating a modified example of the second embodiment.

For example, as illustrated in FIG. 22, in the configuration of FIG. 16, the common signal line 108 may have a cut-out portion 603 formed by cutting out the common signal line 108 intersecting with the inclined portion of the through hole 601. With this, a stepped portion may be formed also in the direction along the gate line 105, and hence the entrance of the alignment film solution into the through hole 601 can be more facilitated. Further, another stepped portion may be formed by other methods, such as, instead of forming the cut-out portion 603, forming a protruding portion on the common signal line 108 intersecting with the inclined portion of the through hole 601, or forming the above-mentioned cut-out portion 603 and the above-mentioned protruding portion.

While there have been described what are at present considered to be certain embodiments of the invention, it will be understood that various modifications may be made thereto, and it is intended that the appended claims coverall such modifications as fall within the true spirit and scope of the invention.

What is claimed is:

1. A display apparatus, comprising a substrate comprising:
    a pixel electrode;
    an organic insulating film;
    a common electrode laminated on the organic insulating film so as to be opposed to the pixel electrode via an insulating layer;
    a common signal line connected to the common electrode; and
    a transistor configured to apply, to the pixel electrode, a voltage signal input to a signal line,
    the pixel electrode being connected to a source electrode of the transistor via a through hole formed through the organic insulating film,
    the through hole comprising, in at least one extending portion formed by retreating the organic insulating film toward an outer side of the through hole, a stepped portion formed by laminating a part of the common signal line.

2. The display apparatus according to claim 1, wherein the at least one extending portion has a width smaller than a width of the through hole.

3. The display apparatus according to claim 1, further comprising a gate line connected to a gate electrode of the transistor,
    wherein the at least one extending portion is formed in a direction along the gate line.

4. The display apparatus according to claim 3,
    wherein the common signal line is arranged along the gate line,
    wherein the common signal line comprises a common extending portion extending toward the at least one extending portion, and
    wherein the through hole comprises, in the at least one extending portion, a stepped portion formed by laminating a part of the common extending portion.

5. The display apparatus according to claim 1,
    wherein the at least one extending portion comprises two extending portions, and
    wherein the two extending portions are formed on both sides of the through hole.

6. The display apparatus according to claim 1, further comprising an alignment film on the substrate.

7. The display apparatus according to claim 6, wherein the alignment film is formed by being applied on the substrate by an ink jet system.

8. The display apparatus according to claim 3, wherein the gate electrode is formed of a part of the gate line.

9. The display apparatus according to claim 1, wherein the common electrode is made of ITO.

10. The display apparatus according to claim 1, wherein the common signal line is made of a metal.

11. The display apparatus according to claim 1, wherein the at least one extending portion is formed in a direction along the signal line, and has the same width in a direction along the gate line as the through hole.

12. The display apparatus according to claim 11,
    wherein the common signal line has a cut-out portion in apart of an inclined portion of the through hole, and
    wherein the stepped portion is further formed along with the cut-out portion.

13. The display apparatus according to claim 11,
    wherein the common signal line has a protruding portion in a part of an inclined portion of the through hole, and
    wherein the stepped portion is further formed along with the protruding portion.

14. The display apparatus according to claim 11, wherein the stepped portion is formed on an opposite side to the pixel electrode side.

* * * * *